United States Patent [19]
Asar

[11] Patent Number: 5,473,254
[45] Date of Patent: Dec. 5, 1995

[54] TEST PROBE ASSEMBLY PROVIDES PRECISE AND REPEATABLE CONTACT FORCES

[75] Inventor: Madhu P. Asar, Reynoldsburg, Ohio

[73] Assignee: AT&T Corp., Murray Hill, N.J.

[21] Appl. No.: 289,717

[22] Filed: Aug. 12, 1994

[51] Int. Cl.[6] .................................................. G01R 31/02
[52] U.S. Cl. ........................ 324/537; 324/754; 324/757; 439/482
[58] Field of Search .................................... 324/754, 756, 324/757, 758, 149, 72.5, 537, 538; 439/482

[56] References Cited

U.S. PATENT DOCUMENTS

| | | | |
|---|---|---|---|
| 4,912,400 | 3/1990 | Plante | 324/754 |
| 5,006,793 | 4/1991 | Gleason et al. | 324/754 |
| 5,068,600 | 11/1991 | Hilz et al. | 324/754 X |
| 5,311,119 | 5/1994 | Bullock et al. | 324/754 X |

OTHER PUBLICATIONS

"Ball Slides", TUSK catalog, p. 4, 1986.
"Measuring the Contact Resistance of Circuit Pack Connectors", Gary E. Kleindedler, *The Engineer*, Second Issue 1983, pp. 11–15.
"Air Cylinder, Series CJ2", SMC catalog E223-A, pp. 27–28, 36, 106, 1988.

Primary Examiner—Kenneth A. Wieder
Assistant Examiner—Diep Do
Attorney, Agent, or Firm—Charles L. Warren

[57] ABSTRACT

A test fixture is provided for testing the resistance associated contamination material on the surface of electrical contacts mounted to a printed circuit board. An elongated probe is provided which has an axis perpendicular to X and Y planes. A mechanism is provided for maintaining the probe in a precise perpendicular orientation to the X and Y planes while permitting movement of the probe along its axis in the Z plane to engage an aligned contact. A predetermined bias force is exerted by the probe along its axis while engaging the contact to be tested.

10 Claims, 7 Drawing Sheets

TEST PROBE ASSEMBLY PROVIDES PRECISE AND REPEATABLE CONTACT FORCES

BACKGROUND OF THE INVENTION

This invention relates generally to electronic test apparatus and more specifically, to such apparatus in which a probe is utilized to engage a contact. The present invention is more particularly directed to an electronic apparatus utilized for measuring contamination resistance associated with contacts mounted on a printed circuit board. Contamination resistance refers to the resistance associated with a layer or film of material associated with electronic contacts which increases the resistance of a connection made by a jack or pin inserted into the contact.

Various types of test fixtures and probes have been utilized for testing printed circuit boards. However, difficulties have been encountered in being able to make stable and repetitive measurements of contamination resistances associated with contacts on a printed circuit board.

SUMMARY OF THE INVENTION

It is an object of the present invention to provide an electronic apparatus capable of making repetitive and consistent measurements of contamination resistance associated with contacts of a printed circuit board.

In accordance with an embodiment of the present invention, the contamination resistance measuring apparatus includes a probe assembly having probes dimensioned to engage a corresponding contact on a printed circuit board which is mounted to the apparatus. A drive mechanism is provided for controlling the position of the probe in X, Y, and Z planes thereby allowing the probe assembly to be utilized to sequentially engage a plurality of the contacts. An elongated probe has its axis in the Z plane which also contains the axis or center line of the contacts to be tested. A mechanism is provided for maintaining the elongated probe precisely perpendicular to the X and Y planes while permitting substantially unimpeded movement of the probe along its axis in the Z plane. A mechanism is provided for exerting a predetermined bias force on the probe along its elongated axis relative to a mounting mechanism. This, in turn, causes the probe to exert the predetermined force on a corresponding contact with which the probe is engaged.

An important aspect in accordance with the present invention resides in identifying a problem associated with previous techniques utilized to measure contamination resistance. It has been determined that precise control and orientation of a probe while engaging a contact to be measured is important in order to obtain repeatable measurements. The problems of being able to obtain reliable contamination resistance measurements have been substantially overcome in accordance with the present invention.

DETAILED DESCRIPTION

Figure 1:
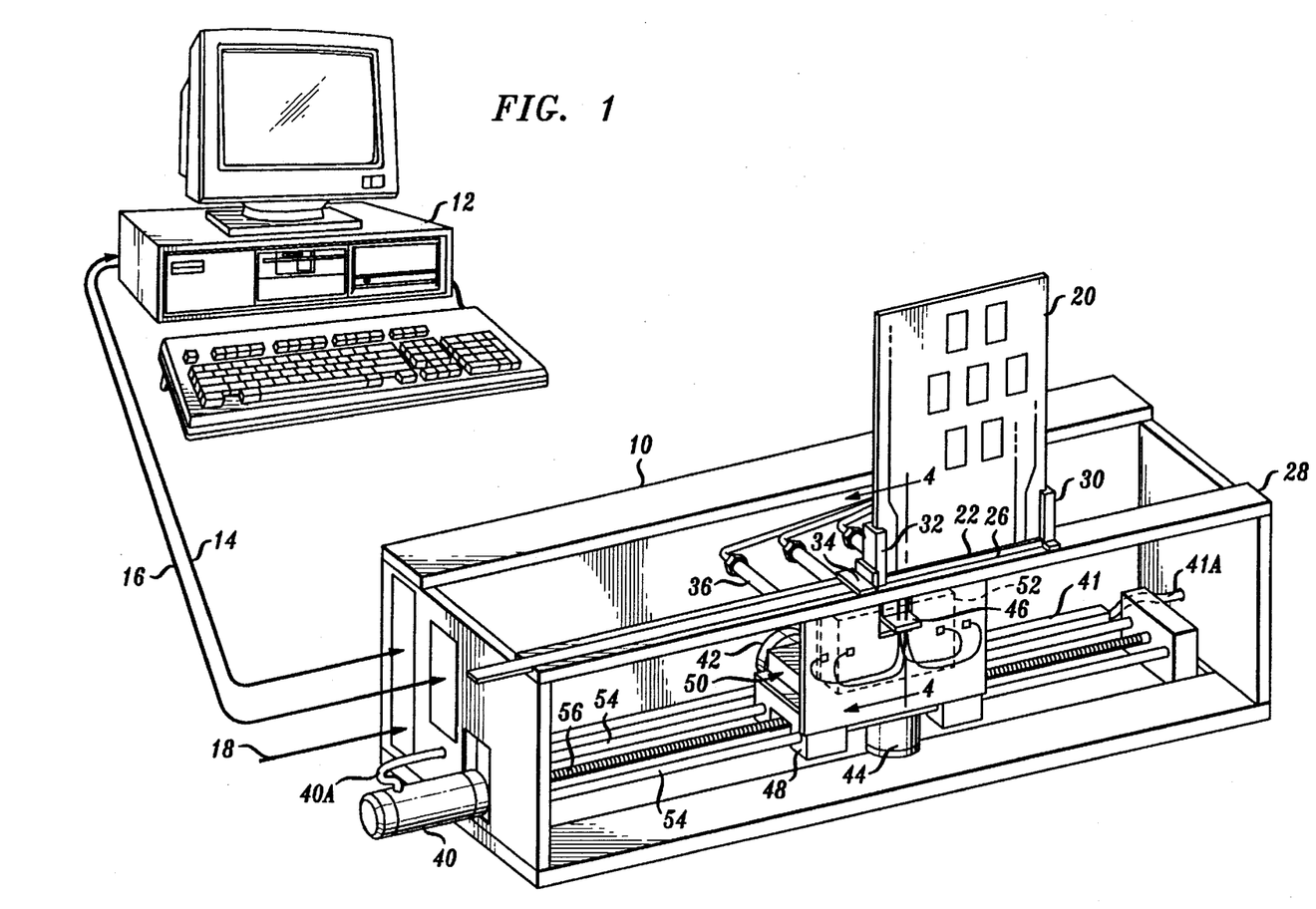
FIG. 1 illustrates a system in accordance with the present invention for measuring contact contamination resistance of connectors mounted to a printed circuit board.

The purpose of the system as shown in FIG. 1 is to measure the contamination resistance associated with the contacts (connectors) in connector assembly 22 of printed circuit board (PCB) 20. Contamination resistance is the electrical resistance caused by various types of contamination films and materials which may become disposed on the electrical contacts in assembly 22. Such contamination may result from the soldering or cleaning operations associated with PCB 20 or other manufacturing operations. Excessive resistance exhibited between electrical pins which will be received in the female contacts of assembly 22 may lead to a higher than expected resistance connection of signals flowing between the respective jack and female contact, or may lead to an intermittent connection due to the contamination between the jack and the contact. The illustrative system measures the contamination resistance associated with the contacts in assembly 22 as a quality assurance. This testing includes the insertion of conductive probes associated with probe assembly 46 into at least a sampling of the contacts of assembly 22 and calculating the contamination resistance associated with such measurements.

FIG. 1 illustrates an embodiment of a system in accordance with the present invention for making contact contamination resistance measurements. A resistance measuring device 10 operates under the control of a personal computer 12 which is coupled to device 10 by communication lines 14 and 16. The resistance measuring device 10 also receives conventional AC power by power line 18. A printed circuit board (PCB) 20 includes a connector assembly 22 including a plurality of female contacts (not seen in FIG. 1; see FIGS. 4 and 6). The connector assembly 22 is seated within a longitudinal channel 26 disposed in a front structural element 28 of device 10. The contacts of assembly 22 are accessible from the bottom of structure 28 for probing. A fixed edge holder 30 provides a stop for the right edge of PCB 20 as shown in FIG. 1. A movable edge holder 32 engages the left edge of the PCB 20 and can be moved laterally to accept different widths of printed circuit boards since it is mounted to a movable slide 34 which can be slid within channel 26. A plurality of air-operated solenoids (cylinders) 36 are disposed in spaced-apart relationship along channel 26 so that the cylinder rods (arms) 38 (not seen in FIG. 1; see FIG. 6) can be extended so as to engage connector assembly 22 to securely hold the connector assembly within channel 26.

The device 10 includes motors 40, 42, and 44 which are utilized to control the position of probe assembly 46 in the X, Y, and Z axes, respectively. The motors are operated under the control of PC 12. Movement control assemblies 48, 50, and 52 have their positions controlled by motors 40, 42, and 44, respectively, thereby controlling the position of the probe assembly 46 in the X, Y, and Z axes, respectively. Assembly 48 moves along the X axis as supported by guide rods 54 and is controlled by threaded rod 56 as driven by motor 40. Similarly, assemblies 50 and 52 are guided for support in the Y and Z axes as controlled by motors 42 and 44, respectively. It will be well known to those skilled in the art that a variety of techniques exist for providing three-dimensional control of a sensor or object. Since a variety of mechanisms and assemblies can be utilized to accomplish the three-dimensional control of the probe assembly 46, specific structural details and operation of these mechanisms are not described.

Figure 2:
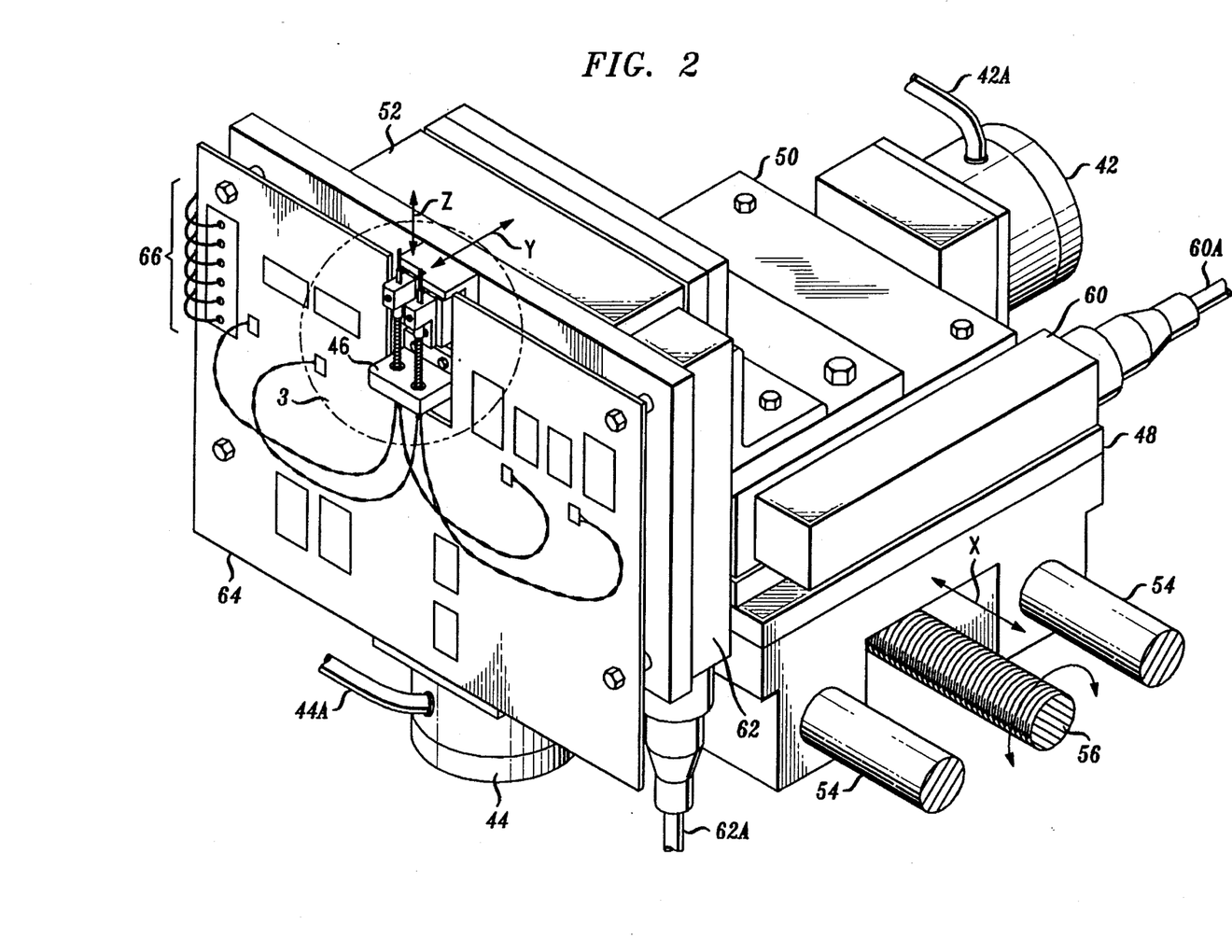
FIG. 2 illustrates a drive assembly as shown in FIG. 1 which controls the positioning of a probe assembly relative to the connectors to be measured. The assembly carries circuitry utilized in making the resistance measurements.

FIG. 2 more specifically illustrates the mechanisms 48, 50, and 52 utilized to control the position of the probe assembly 46 relative to the contacts in connector assembly 22. Limit switch assemblies 60 and 62 provide over-travel and zero reference (home) position feed back used by the computer 12 and carried by cables 60A and 62A, respectively. Motor drive cables 42A and 44A control power to motors 42 and 44, respectively, as determined by computer 12. Similarly, as best seen in FIG. 1, limit switch assembly 41 provides control signals carried by cable 41A to computer 12, and motor drive cable 40A controls the power to motor 40 under the control of computer 12. Each limit switch assembly may contain near and far over travel switches and a home switch that establishes a reference position for the corresponding axis. Cable 14 carries the signals associated with cables 40A, 41A, 42A, 44A,, 60A, and 62A.

A single printed circuit board 64 is mounted to assembly 52 and contains circuitry associated with the making of the resistance measurements in conjunction with the probe assembly 46. The circuitry and probe assembly are described below. A plurality of wires 66 coupled to the circuitry on PCB 64 are coupled to PC 12 via cable 16 as shown in FIG. 1. The control signal conductors associated with cables 60 and 62, as well as the cable associated with the control of motor 40, are coupled to PC 12 via cable 14 as shown in FIG. 1. Once the probes in the probe assembly 46 are aligned in the X and Y axes with connectors in the connector assembly (see FIG. 4), the motor 44 controlling the Z axis moves the probe assembly upward along the Z axis to engage the connectors. After a resistance measurement has been taken, motor 44 causes assembly 52 including probe assembly 46 to move downward in the Z direction to disengage the connector following the measurement.

Figure 3:
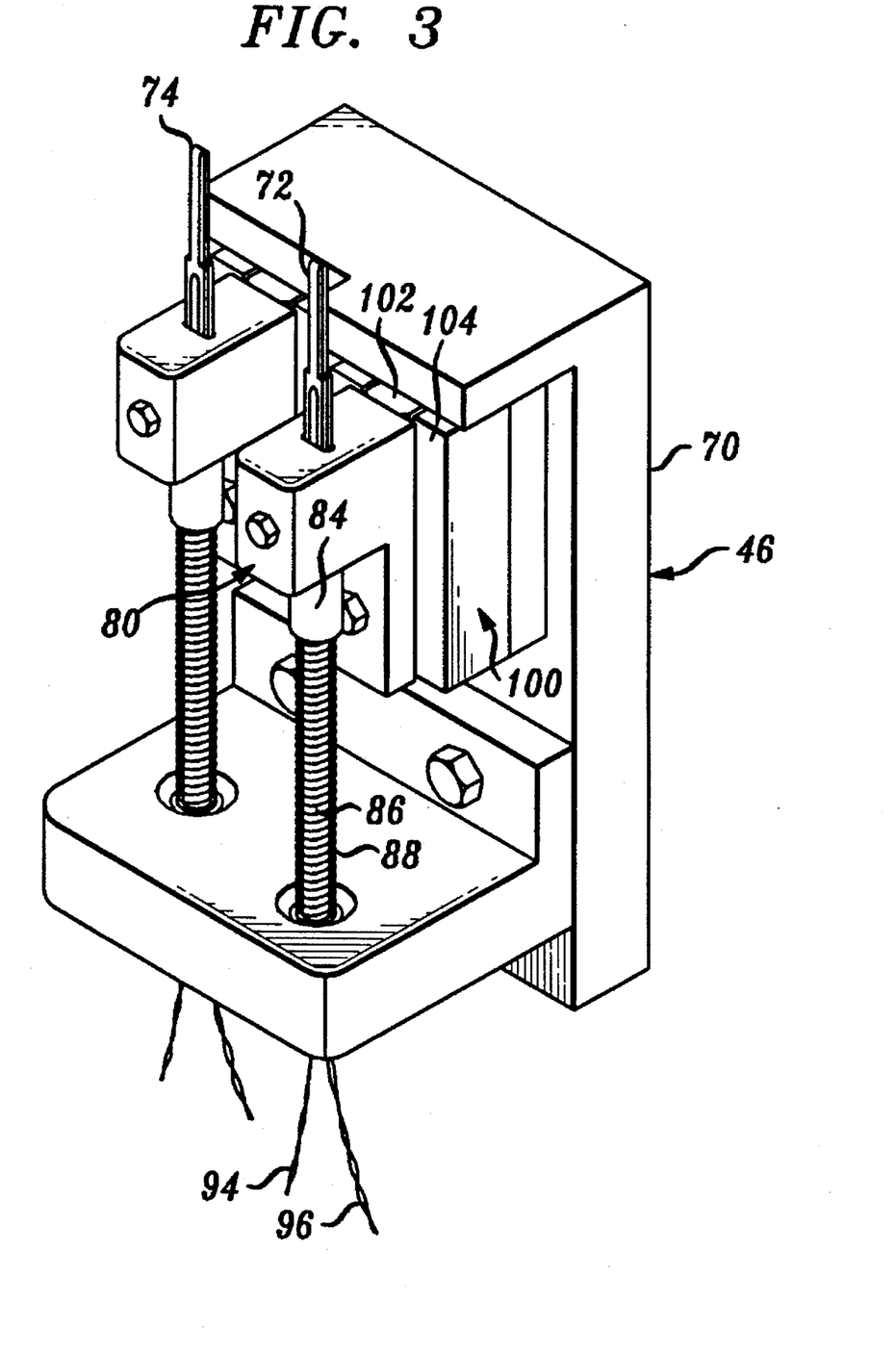
FIG. 3 illustrates the probe assembly as shown in FIG. 2.
Figure 4:
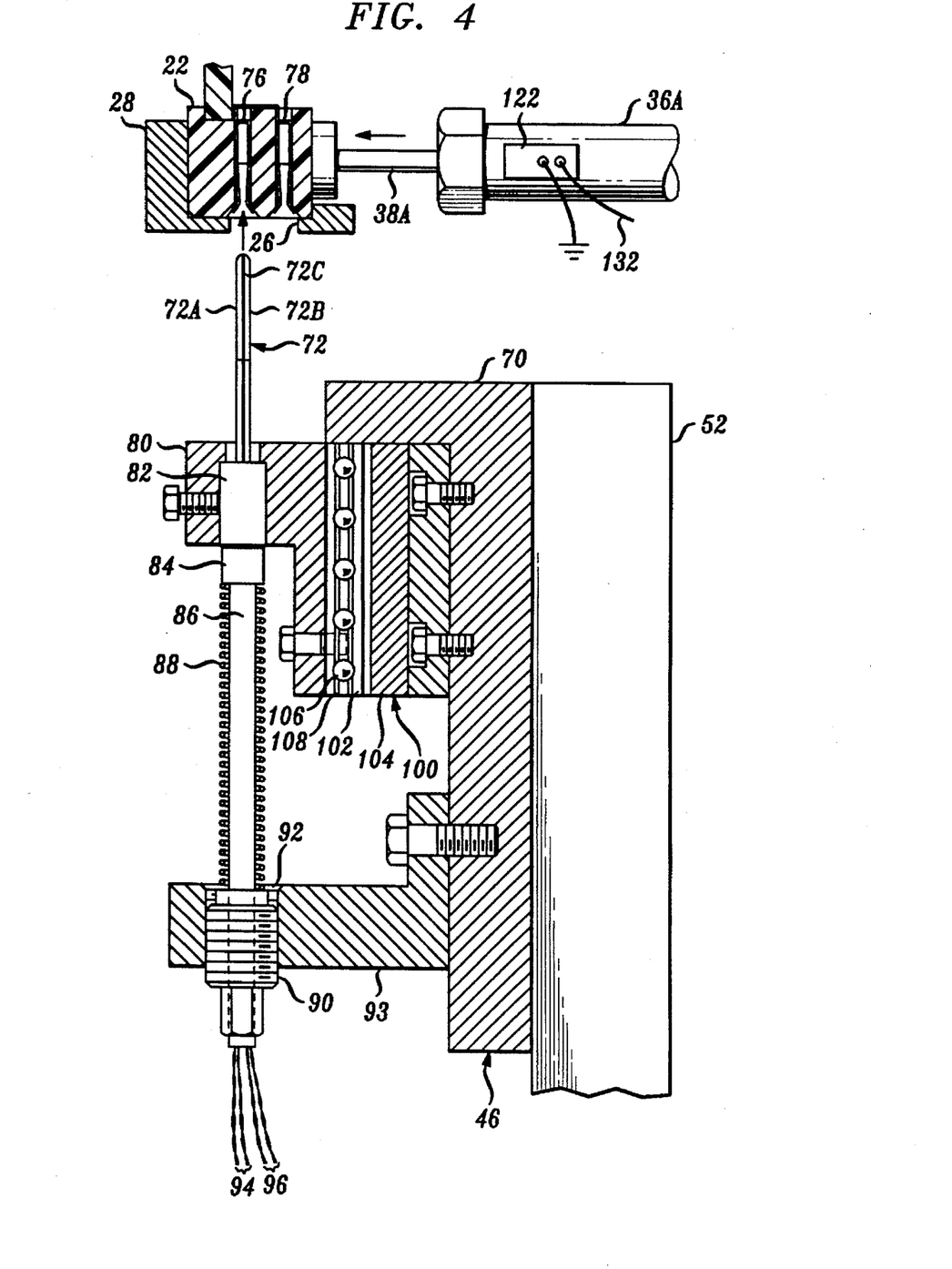
FIG. 4 is a partial cross-sectional view taken along line 4—4 of FIG. 1 which illustrates the relationship between a probe and the connectors to be measured.

Referring to FIGS. 3 and 4, the probe assembly 46 includes a main bracket or housing 70 which is mounted to assembly 52. In the illustrative embodiment, probes 72 and 74 are spaced apart in the X axis and offset in the Y axis so as to concurrently engage contacts 76 and 78 in the connector assembly 22 when the probe assembly 46 is moved upward in the Z direction during a measurement. The spacing in the X axis is consistent with the spacing in the X axis between contacts. The offset or spacing in the Y axis equals the center-to-center spacing in the Y direction between the two rows of contacts. This allows two different contacts (one in each of two rows) to be measured during one upward movement in the Z direction of probe assembly 46. The probes 72 and 74 as well as their supporting structure are identical, and hence only the supporting structure relating to probe 72 will be described.

Probe 72 is mounted to a bracket 80 by an insulating sleeve 82. A tubular collar portion 84 of sleeve 82 receives a hollow tube 86 about which a helical spring 88 is wrapped. A stop (not shown) in collar 84 engages tube 86 and spring 88. A hollow threaded sleeve 90 engages a threaded hole 92 in a support bracket 93 so as to permit the passage of tube 86 while providing a stop for the other end of spring 88. The nut 90 is adjusted to provide a predetermined bias force in the Z direction for probe 72. Two pairs of wires 94 and 96 connected to probe 72 pass through the hollow tube 86. As will be discussed in detail below, each of the pairs of wires 94 and 96 are attached to respective first and second probe segments which constitute the probe 72.

Probe holding bracket 80 is mounted to a mechanism 100 which maintains probe 72 in a precisely perpendicular alignment to the X and Y planes while permitting substantially unimpeded movement of probe 72 along the Z axis. In the illustrative embodiment of the present invention, the mechanism 100 is a ball slide device. This device includes an element 102 which is free to move relative to element 104 in the Z direction as shown in FIG. 4 as guided by ball bearings 106 which operate within a race 108. The bearing and race arrangement disposed between elements 102 and 104 define a precise controlled linear movement in only a single direction. FIG. 4 shows spring 88 urging the sliding element 102 against a stop portion of bracket 70.

In preparation for making a resistance measurement, assembly 52 is driven upward in the Z axis by motor 44 by a distance sufficient to cause probe 72 to engage the contact 76 thereby stopping the vertical motion of the probe 72. This causes spring 88 to be compressed. In the illustrative embodiment the force applied by spring 88 is insufficient to overcome the resistance of the leaves of contact 76. Element 104 of the ball slide 100 is fixedly mounted to bracket 70 restricting the movement of probe 72 to movement only in the Z axis.

Figure 5:
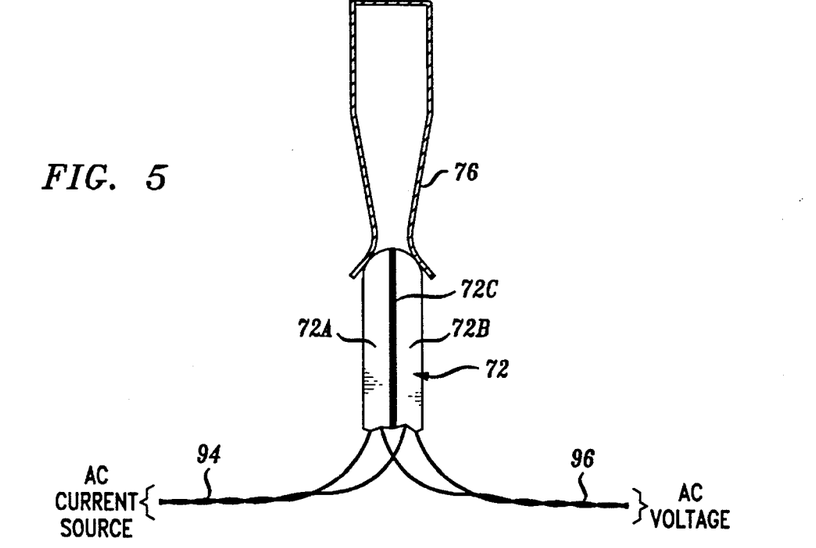
FIG. 5 is an enlarged cross-sectional view of the probe in engagement with a connector in position to make a resistance measurement.

FIG. 5 is an enlarged view illustrating the engagement of probe 72 and contact 76. As illustrated, contact 76 has a downward flair such that increasing mechanical resistance is applied to a pin inserted when the PCB is mounted for operation. The force provided by spring 88 urges the probe 72 into engagement with the contact but is not sufficient to cause substantial spreading of the leaves of the contact. This results in only the distal end of the probe abutting the contact. Probe 72 is preferably gold plated and consists of a first probe segment 72A and a second probe segment 72B which are separated by a layer of insulating material 72C so as to comprise a sandwich of separated conductive probes. The distal end of the probe 72 is preferably rounded like a dome. A constant current source of alternating current (AC) is connected across probe segments 72A and 72B by wires 94. This results in an induced AC voltage drop which is coupled by wires 96 to sensing circuitry which will be described below. By generating an AC current of predetermined magnitude which is connected across or in parallel with probe segments 72A and 72B, the magnitude of the AC voltage drop will be proportional to the resistance across the probe segments 72A and 72B.

The total sensed resistance by this measurement can be conceptualized as represented by three series resistances: bulk resistance of the probe segments and the contact under test; contact resistance which would be present between a clean contact and clean probe segments 72A and 72B; and contamination resistance typically due to a film of contamination material existing between the surfaces of the contact and the areas of probe segments 72A and 72B which engage the contact. In accordance with a preferred embodiment of the invention, data representing previous resistance measurements made between clean probes and clean contacts are recorded and stored in PC 12. This data represents the combined bulk and contact resistance. The contamination resistance can be determined by subtracting these predetermined resistances from a measurement made of contacts of unknown contamination levels.

Figure 6:
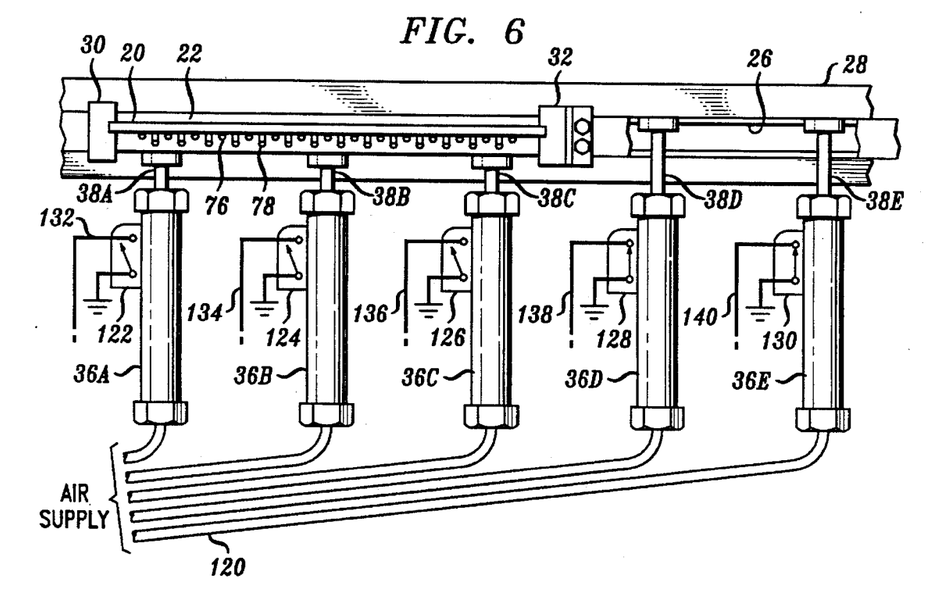
FIG. 6 illustrates a partial top view of the measurement apparatus as shown in FIG. 1, showing the utilization of air-driven cylinders (solenoids) to captivate the printed circuit board and connector assembly to the apparatus in preparation for a resistance measurement.

Referring to FIG. 6 and FIG. 4, a plurality of air-driven solenoids 36A–36E are spaced apart and aligned so that their respective cylinder rods (arms) 38A–38E will engage the side of connector assembly 22 if the connector assembly is opposite a respective cylinder. If the connector assembly is of a length such that some of the cylinder rods of the cylinders will not engage the connector assembly, the cylinder rods of such cylinders will proceed to extend further forward as indicated by cylinder rods 38D and 38E. Each of the cylinders is driven by a cable connected to a supply of air at an appropriate pressure to cause a desired force to be exerted by the respective cylinder rods on connector assembly 22. The force provided by the extended cylinder rods engaging connector assembly 22 securely holds the connector assembly in place in the channel 26 and prevents movement of the connector assembly as the probes engage the contacts of the assembly. An electrically controlled air valve (not shown) operates under the control of PC 12 so as to simultaneously supply or not supply air to the solenoids. It will be apparent to those skilled in the art that other types of solenoids driven by other types of force could be utilized to provide the desired action of clamping or captivating the connector assembly 22 securely to member 28.

Switches 122–130 are associated with solenoids 136A–136E, respectively, and are designed to provide an indication of whether the respective cylinder rods of the solenoids have extended beyond a predetermined travel. In the illustrative example, the solenoids are placed at a distance relative to channel 26 and the connector assembly 22 such that the switches remain in an open position if the cylinder rods engage the connector assembly but will close to provide continuity if the cylinder rods travel further as is the case with cylinder rods 38D and 38E. Thus, switches 128 and 130 are closed while the remaining switches 122, 124, and 126 are open providing signals on wires 132–140 to PC 12 indicative of whether the cylinders have engaged the connector assembly or not. These wires are part of the signals coupled to PC 12 via cable 16. Since the purpose of the device 10 is to permit the testing of printed circuit boards and connector assemblies of different lengths, this provides an indication of the length of connector assembly disposed for test in device 10. Since the resistance test program may vary for different connector assemblies and lengths of connector assemblies, the signals carried by wires 132–140 provide feedback signals which are monitored by a routine in the control program of PC 12 to determine if the actual printed circuit board 20 and its corresponding connector assembly 22 inserted for test in device 10 is consistent with the type of test selected by an operator of the system.

For example, it may be desirable to test a predetermined percentage of the number of contacts in a connector assembly to insure statistical significance. Thus, for a longer connector assembly with a larger number of contacts, more of the contacts will need to be probed and resistance measurements taken in order to satisfy the desired criteria. A user may select different programs which correspond to the different number of tests and contacts to be tested. The feedback signals provided by wires 132–140 provide the program with information which can be used to confirm that the number of contacts selected to be tested by a given test program exist, i.e. that a printed circuit board of the type selected for testing has actually been inserted into device 10. The use of solenoids which have integrated capabilities for providing an indication of the amount of travel of their respective cylinder rods provides the dual function of holding the connector assembly in place and providing feedback signals indicative of the length of the actual connector assembly in device 10.

Figure 7:
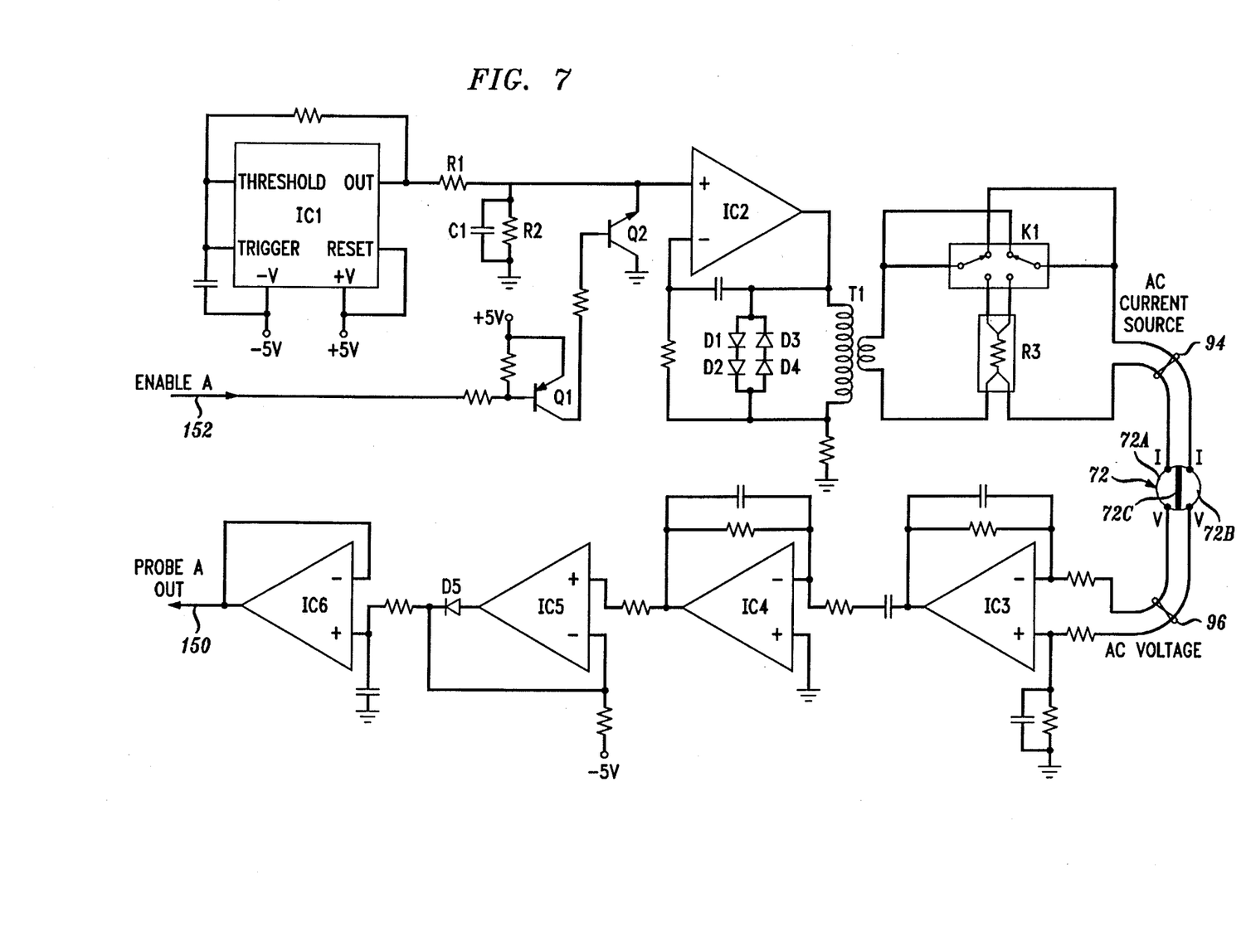
FIG. 7 is a schematic diagram illustrating circuitry utilized in accordance with an embodiment of the present invention to make the resistance measurement.

FIG. 7 illustrates a schematic diagram of circuitry in accordance with the present invention. The upper portion of the circuitry shown in FIG. 7 is utilized to provide a constant current source of AC current of predetermined magnitude to probe 72 by wires 94. The bottom portion of the circuitry senses the voltage developed across probe segments 72A and 72B as induced by the constant current, amplifies the sensed AC voltage delivered by wire 76, rectifies the AC voltage to provide a DC voltage, and provides a buffered output of the DC voltage to output channel 150 which is coupled to PC 12 as part of the measurement system cable 16.

The constant current producing circuitry includes an integrated circuit IC1, which may comprise a 555 timer which is used to generate a square wave signal which is scaled and filtered by components R1, C1, and R2. An enable line 152 controls transistors Q1 and Q2 to determine whether the square wave from IC1 is delivered to amplifier IC2. A low or ground signal on enable line 152 causes transistor Q1 and Q2 to conduct and causes Q2 to reflect a low impedance to ground path at the input to IC2 thereby substantially attenuating the signal. The NPN transistor Q2 is used in an inverted configuration (the functions of the collector and emitter are reversed, i.e. collector to ground, and emitter to the input to be shunted) to provide a very low saturation voltage. In accordance with an embodiment of the present invention, the illustrative circuitry in FIG. 7, except for the basic generator of IC1, is duplicated for the other probe 74. Thus, the enable line is utilized to selectively enable the particular circuitry associated with the probe which is making a measurement. Preferably, both probes are not activated for measurement simultaneously in order to minimize the possibility of "cross talk" which could cause one circuit to interfere with the measurement being made by the other circuitry. Cross talk is further minimized by the isolation provided by transformer T1. Another advantage of the isolation of transformer T1 is that interconnections on the PCB 20 between the contacts do not interfere with the contamination resistance measurements. Diodes D1, D2, D3 and D4 limit the voltage that can be generated across the primary of transformer T1 and hence limit the current source to producing about 40 millivolts at the transformer's secondary if an open circuit load (no load to probe) is encountered. This is designed to prevent break down of a thin layer of contamination on the contact being measured due to too high a voltage. If a break down were to occur, a thin layer of contamination would likely go undetected due the lowered resistance that would result from the break down.

Integrated circuit IC2 is utilized to convert the input AC voltage from IC1 to a regulated AC current driving the primary of transformer T1. The secondary of transformer T1 is coupled to wires 94 to provide a constant current source of AC current such as at 100 milliamperes. Relay K1 which operates under the control of PC 12 can be activated to cause it to place a precision resistor R3 across the secondary output of transformer T1 to provide a calibration standard of known resistance for the resistance measurement system. This calibration is conducted with the probe not engaging a contact so that a resulting DC voltage present at output 150 for a known resistance across probe segments 72A and 72B can be determined. Relay K1 is illustrated in the inactivated or normal operating state in which resistor R3 is not placed in parallel with the secondary of transformer T1.

The AC voltage developed by the AC current will be proportional to the resistance across probe segments 72A and 72B. This voltage is amplified with band pass filtering provided by amplifiers IC3 and IC4 and the accompanying associated circuitry. Integrated circuit IC5 in combination with diode D5 serves to rectify the AC voltage and provides a DC voltage as an input to buffer IC6 which provides a unity gain buffering function to drive line 150 with the DC voltage. It will be apparent to those skilled in the art that the DC output voltage on line 150 will be proportional to the resistance across probe 72 in accordance with Ohms law.

Figure 8:
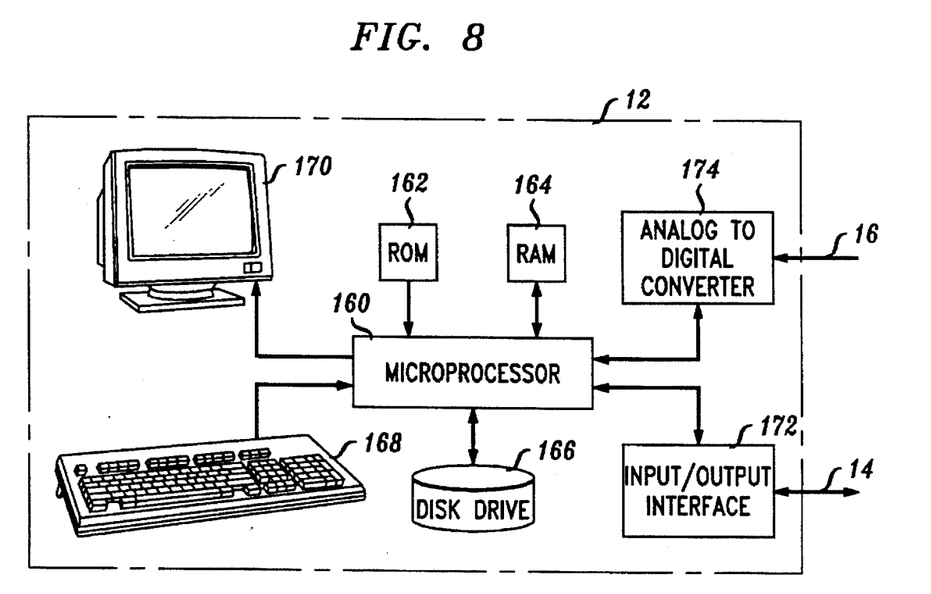
FIG. 8 is a block diagram illustrating the personal computer as shown in FIG. 1 which is utilized in accordance with an embodiment of the present invention in making the resistance measurement.

FIG. 8 illustrates a block diagram of personal computer 12 which includes a microprocessor 160 which is supported by read-only memory (ROM) 162, random access memory (RAM) 164 and a nonvolatile storage device such as a hard disk drive 166. User inputs are provided to the microprocessor by keyboard 168; outputs visual and audible are provided by monitor 170. An input/output interface device 172 provides an interface between microprocessor 160 and the signals received from and sent to resistance measuring device 10 via communication lines 14. The input/output interface device 172 preferably includes a commercially available three axis motor controller I/O board for controlling the X, Y, and Z motors. Such a motor controller board accepts movement commands from microprocessor 160 and generates appropriate enable, step, and direction signals for each motor as well as controlling the proper sequence of operation of the motors. This board monitors and responds to the status of the home and limit switches associated with each motor. An analog-to-digital converter 174 converts the received DC voltages indicative of the measured resistance into digital data having a corresponding value. The DC voltages are carried by channel 16 and lines 150 for probes 72 and 74. This digital data is processed by microprocessor 160 in order to derive the resistance associated with contamination of the contact upon which the resistance measurement was made. The microprocessor operates under the control of program instructions such as stored in ROM 162 and disk drive 166 to process the measurements and to control the operation of resistance device 10.

An example of operation of the illustrative contamination resistance measuring system is provided in the following table.

TABLE

1. The user selects the specific PCB/connector assembly to be tested from a table of selections provided as a menu on the monitor of the PC.

2. The user then inserts the corresponding PCB into the test fixture and enters the appropriate start command from the keyboard of the PC.

3. The PC sends signals to the test fixture causing the solenoids to activate, i.e. causing their cylinder rods to be extended to engage and clamp the connector assembly 22 in place. The PC then checks the state of the switches associated with the solenoids against a stored table of correct states for the selected test program. If the sensed switch conditions do not match with the table, an error condition exists and a message is displayed on the PC monitor advising the user to check for the insertion of the proper PCB and to check the selection of a proper test program. Assuming that the switch states match with the anticipated switch states stored in the table associated with the selected test program, the test proceeds.

4. A self calibration test is initiated by the PC sending a signal causing relay K1 to change from the normal test position (as shown in FIG. 7) to the calibrate position, thereby placing the calibration resistance in parallel across the first probe presenting its Kelvin connections to the measurement system. The PC then sends an enable signal via line 152 activating the circuitry associated with the first probe. The developed DC voltage is output on lines 150 and 16, and converted into digital data at the PC. This voltage represents the measured resistance of a known resistor, e.g. 100 milliohms. The PC calculates a calibration factor which is the ratio of the actual resistance to the measured voltage. This calibration factor accounts for all the system gains (including the current source and sensing circuitry). The calibration factor is stored in memory. During actual measurements of contact resistance, the measured voltage is multiplied by the calibration factor to determine the unknown resistance of the contact under test.

5. The program homes the probe assembly to a reference X, Y, Z position and then proceeds to locate a table of stored data to determine the corresponding X, Y, Z test positions of the probe assembly for the selected test program. A first X, Y, Z location is selected.

6. The PC sends a sequence of command signals controlling the X, Y, Z motors which cause the probe assembly to move into the appropriate X, Y position and then engage a first set of contacts by moving upward in the Z direction.

7. The PC sends an enable signal causing the first probe measuring circuitry to be enabled. A first resistance measurement is made and the corresponding digital value stored. This measured value is adjusted by multiplying it by the calibration factor stored in memory.

8. While still in the same X, Y, Z position, the PC preferably sends a signal disabling the circuitry associated with the first probe and sends an enable signal to enable the circuitry associated with the second probe. The resistance measured with the second probe is stored in the PC as a digital value and adjusted by the calibration factor.

9. The PC then proceeds to calculate the contamination resistances associated with each stored digital data value representing a measured and adjusted resistance. This calculation consists of subtracting a predetermined bulk resistance value, representing the probe resistance and the normal surface resistivity associated with a clean contact and probe, from each measured value to obtain the contamination resistance. The bulk resistance of each probe is predetermined and stored in memory during a probe characterization procedure performed periodically.

10. The program compares each calculated contamination resistance for each probe to a predetermined acceptance range of contamination resistances stored for the corresponding PCB. A first time pass/fail determination is made for the two contacts measured. If either measured resistance fails the test, i.e. is outside the acceptance range, the probe assemblies are lowered in the Z axis to disengage the contacts, raised again to re-engage the same contacts, and the measurements made again. A failure is determined if the second measurement of a contact is also outside the acceptance range. The PC displays the measured contamination resistances; resistances which are not within the acceptable range are marked with a flag for easy visual identification. Two successive fail measurements for a contact are required in the illustrative embodiment for a failure to be determined.

For example, a failing measurement of a contact on the first try followed by a passing measurement on the second try would be considered a "pass". This process is repeated until all contacts to be tested have been measured and values stored in memory.

11. The calculated contamination resistance values are displayed on the monitor of the PC as a two column table where each column shows the resistances associated with the measurements for the first and second probes, respectively. The PC also displays an overall board pass/fail indication based on exceeding a predetermined number of contact resistance failures associated with each board.

12. The data associated with the resistance measurements of a PCB are preferably stored in the PC's memory and utilized for statistical determinations associated with quality control and process monitoring.

13. Following the completion of the testing of all contact locations for the selected PCB, the probe is returned to a "home" X, Y, Z location.

Although an embodiment of the invention has been described and illustrated in the drawings, the scope of the invention is defined by the claims which follow.

I claim:

1. In an electronic apparatus that tests electrical contacts mounted to printed circuit boards, the apparatus including means for probing at least selected contacts of said electrical contacts, drive means for causing the probing means to move in a Z plane to engage an aligned contact at a location in the X and Y planes which are perpendicular to the Z plane, and means coupled to the probing means for measuring the electrical resistance at the contact engaged by the probing means, the probing means comprising:

means for mounting said probing means to the drive means;

an elongated probe having an elongate axis in the Z plane;

ball slide mechanism mounted to said mounting means for guiding said elongated probe precisely perpendicular to the X and Y planes while permitting substantially unimpeded rearward movement of the probe along said elongate axis in the Z plane relative to said mounting means;

means connected to said mounting means and elongated probe for exerting a predetermined forward bias force on said probe along said elongate axis of the probe relative to said mounting means so that the probe in turn exerts said predetermined force on the aligned contact while engaging said contact.

2. The apparatus according to claim 1 wherein said exerting means comprises an elongated coiled spring disposed with its axis parallel to said probe's elongate axis, one end of said spring being coupled to said probe and the other end of said spring being attached to said mounting means.

3. The apparatus according to claim 1 wherein said probe comprises first and second electrically conductive, rigid, probe segments, and an electrically insulating member, said probe arranged as a sandwich with said member being disposed between said first and second probe segments.

4. The apparatus according to claim 2 wherein said exerting means further comprises a first abutment mounted to said probe and a second abutment on said mounting means disposed to engage said first abutment, said spring urging said first abutment to engage said second abutment thereby providing a forward bias force to said probe.

5. The apparatus according to claim 1 wherein said ball slide mechanism permits rearward movement in the Z plane of the probe relating to the mounting means in response to rearward force applied to the probe upon engagement of the probe with said selected contact.

6. A probe mechanism that tests electrical contacts mounted to printed circuit boards, the probe mechanism comprising:

a housing;

an elongated probe having an elongate axis in the Z plane, the Z plane being orthogonal to X and Y planes;

ball slide mechanism mounted to said housing for supporting and guiding said elongated probe precisely perpendicular to the X and Y planes while permitting substantially unimpeded rearward movement of the probe along said elongate axis in the Z plane relative to said housing;

means mounted to the probe and ball slide mechanism for exerting a predetermined forward bias force on said probe along said elongate axis of the probe relative to said housing so that the probe in turn exerts said predetermined force on an engaged contact.

7. The mechanism according to claim 6 wherein said exerting means comprises an elongated coiled spring disposed with its axis parallel to said probe's elongate axis, one end of said spring being coupled to said probe and the other end of said spring being attached to said housing.

8. The mechanism according to claim 6 wherein said probe comprises first and second electrically conductive, rigid, probe segments, and an electrically insulating member, said probe arranged as a sandwich with said member being disposed between said first and second probe segments.

9. The mechanism according to claim 7 wherein said exerting means further comprises a first abutment mounted to said probe and a second abutment on said mounting means disposed to engage said first abutment, said spring urging said first abutment to engage said second abutment thereby providing a forward bias force to said probe.

10. The mechanism according to claim 6 wherein said ball slide mechanism permits rearward movement in the Z plane of the probe relating to the mounting means in response to rearward force applied to the probe upon engagement of the probe with said selected contact.

* * * * *